(12) United States Patent
Matyushkin et al.

(10) Patent No.: US 8,663,391 B2
(45) Date of Patent: Mar. 4, 2014

(54) ELECTROSTATIC CHUCK HAVING A PLURALITY OF HEATER COILS

(75) Inventors: Alexander Matyushkin, San Jose, CA (US); Dennis Koosau, Hayward, CA (US); Theodoros Panagopoulos, San Jose, CA (US); John Holland, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 13/556,156

(22) Filed: Jul. 23, 2012

(65) Prior Publication Data

US 2012/0285619 A1 Nov. 15, 2012

Related U.S. Application Data

(63) Continuation of application No. 11/740,869, filed on Apr. 26, 2007, now Pat. No. 8,226,769.

(60) Provisional application No. 60/796,013, filed on Apr. 27, 2006.

(51) Int. Cl.
*C23C 16/458* (2006.01)
*C23C 16/46* (2006.01)
*C23F 1/00* (2006.01)
*H01L 21/306* (2006.01)
*A21B 1/00* (2006.01)
*A21B 1/22* (2006.01)

(52) U.S. Cl.
USPC . 118/725; 118/724; 156/345.51; 156/345.52; 156/345.53; 219/406; 219/408; 219/483

(58) Field of Classification Search
USPC ........ 118/728, 725, 724; 156/345.51–345.53; 279/128; 219/406, 408, 483
See application file for complete search history.

(56) References Cited

U.S. PATENT DOCUMENTS 4,645,218 A   2/1987  Ooshio et al.
5,059,770 A * 10/1991 Mahawili ...................... 219/391

(Continued)

FOREIGN PATENT DOCUMENTS

CN       1365518 A    8/2002
CN       2585414      11/2003

(Continued)

OTHER PUBLICATIONS

IBM Technical Disclosure Bulletin, vol. 31, No. 1, Jun. 1988, pp. 462-464.

(Continued)

*Primary Examiner* — Rudy Zervigon
(74) *Attorney, Agent, or Firm* — Ashok K. Janah; Janah & Associates, P.C.

(57) ABSTRACT

An electrostatic chuck for receiving a substrate in a substrate processing chamber comprises a ceramic puck having a substrate receiving surface having a plurality of spaced apart mesas, an opposing backside surface, and central and peripheral portions. A plurality of heat transfer gas conduits traverse the ceramic puck and terminate in ports on the substrate receiving surface to provide heat transfer gas to the substrate receiving surface. An electrode is embedded in the ceramic puck to generate an electrostatic force to retain a substrate placed on the substrate receiving surface. A plurality of heater coils are also embedded in the ceramic puck, the heaters being radially spaced apart and concentric to one another.

20 Claims, 10 Drawing Sheets

(56) References Cited

U.S. PATENT DOCUMENTS

| | | | |
|---|---|---|---|
| 5,145,629 A | 9/1992 | Nilsson | |
| 5,155,652 A * | 10/1992 | Logan et al. | 361/234 |
| 5,191,506 A | 3/1993 | Logan et al. | |
| 5,280,156 A * | 1/1994 | Niori et al. | 219/385 |
| 5,306,895 A * | 4/1994 | Ushikoshi et al. | 219/385 |
| 5,310,453 A * | 5/1994 | Fukasawa et al. | 438/716 |
| 5,376,213 A | 12/1994 | Ueda et al. | |
| 5,436,790 A * | 7/1995 | Blake et al. | 361/234 |
| 5,460,684 A | 10/1995 | Saeki et al. | |
| 5,474,614 A * | 12/1995 | Robbins | 118/728 |
| 5,478,429 A | 12/1995 | Komino et al. | |
| 5,527,584 A | 6/1996 | Darfler et al. | |
| 5,529,657 A | 6/1996 | Ishii | |
| 5,530,616 A * | 6/1996 | Kitabayashi et al. | 361/234 |
| 5,534,073 A * | 7/1996 | Kinoshita et al. | 118/728 |
| 5,547,539 A * | 8/1996 | Arasawa et al. | 438/715 |
| 5,561,348 A | 10/1996 | Schoenbach et al. | |
| 5,581,874 A | 12/1996 | Aoki et al. | |
| 5,600,530 A | 2/1997 | Smith | |
| 5,606,484 A | 2/1997 | Kawada et al. | |
| 5,616,024 A * | 4/1997 | Nobori et al. | 432/241 |
| 5,618,350 A * | 4/1997 | Ishikawa et al. | 118/725 |
| 5,625,526 A | 4/1997 | Watanabe et al. | |
| 5,665,260 A | 9/1997 | Kawada et al. | |
| 5,667,622 A | 9/1997 | Hasegawa et al. | |
| 5,671,116 A * | 9/1997 | Husain | 361/234 |
| 5,710,486 A | 1/1998 | Ye et al. | |
| 5,729,423 A * | 3/1998 | Donde et al. | 361/234 |
| 5,730,803 A * | 3/1998 | Steger et al. | 118/723 R |
| 5,737,178 A | 4/1998 | Herchen | |
| 5,745,331 A | 4/1998 | Shamouilian et al. | |
| 5,754,391 A * | 5/1998 | Bates | 361/234 |
| 5,800,618 A * | 9/1998 | Niori et al. | 118/723 E |
| 5,805,408 A | 9/1998 | Maraschin et al. | |
| 5,818,693 A | 10/1998 | Garner et al. | |
| 5,827,585 A | 10/1998 | Giannetti | |
| 5,835,334 A * | 11/1998 | McMillin et al. | 361/234 |
| 5,838,528 A | 11/1998 | Os et al. | |
| 5,858,100 A | 1/1999 | Maeda et al. | |
| 5,865,896 A | 2/1999 | Nowak et al. | |
| 5,880,924 A * | 3/1999 | Kumar et al. | 361/234 |
| 5,883,778 A * | 3/1999 | Sherstinsky et al. | 361/234 |
| 5,886,863 A * | 3/1999 | Nagasaki et al. | 361/234 |
| 5,886,864 A | 3/1999 | Dvorsky | |
| 5,904,872 A * | 5/1999 | Arami et al. | 219/444.1 |
| 5,944,902 A | 8/1999 | Redeker et al. | |
| 5,948,986 A * | 9/1999 | Brown | 73/630 |
| 5,949,650 A | 9/1999 | Bulante et al. | |
| 5,952,060 A | 9/1999 | Ravi | |
| 5,958,140 A | 9/1999 | Arami et al. | |
| 5,958,813 A | 9/1999 | Aida et al. | |
| 5,978,202 A | 11/1999 | Wadensweiler et al. | |
| 5,986,747 A | 11/1999 | Moran | |
| 5,986,874 A * | 11/1999 | Ross et al. | 361/234 |
| 5,996,353 A * | 12/1999 | Maxwell et al. | 62/3.2 |
| 6,035,101 A * | 3/2000 | Sajoto et al. | 392/416 |
| 6,036,878 A * | 3/2000 | Collins | 216/68 |
| 6,048,434 A * | 4/2000 | Tamura et al. | 156/345.52 |
| 6,072,685 A | 6/2000 | Herchen et al. | |
| 6,073,577 A * | 6/2000 | Lilleland et al. | 118/723 E |
| 6,080,970 A * | 6/2000 | Yoshida et al. | 219/444.1 |
| 6,081,414 A * | 6/2000 | Flanigan et al. | 361/234 |
| 6,094,334 A | 7/2000 | Bedi et al. | |
| 6,108,189 A * | 8/2000 | Weldon et al. | 361/234 |
| 6,108,190 A | 8/2000 | Nagasaki | |
| 6,129,046 A | 10/2000 | Mizuno et al. | |
| 6,219,219 B1 * | 4/2001 | Hausmann et al. | 361/234 |
| 6,220,201 B1 | 4/2001 | Nowak et al. | |
| 6,223,447 B1 | 5/2001 | Yudovsky et al. | |
| 6,239,402 B1 * | 5/2001 | Araki et al. | 219/121.4 |
| 6,256,187 B1 | 7/2001 | Matsunaga et al. | |
| 6,268,994 B1 * | 7/2001 | Logan et al. | 361/234 |
| 6,292,346 B1 * | 9/2001 | Ohno et al. | 361/234 |
| 6,296,711 B1 * | 10/2001 | Loan et al. | 118/726 |
| 6,310,755 B1 | 10/2001 | Kholodenko et al. | |
| 6,361,644 B1 | 3/2002 | Collins | |
| 6,362,946 B1 * | 3/2002 | Larsen | 361/234 |
| 6,373,681 B2 * | 4/2002 | Kanno et al. | 361/234 |
| 6,391,437 B1 * | 5/2002 | Kadomura et al. | 428/307.3 |
| 6,394,797 B1 * | 5/2002 | Sugaya et al. | 432/253 |
| 6,436,267 B1 | 8/2002 | Carl et al. | |
| 6,440,221 B2 | 8/2002 | Shamouilian et al. | |
| 6,465,051 B1 | 10/2002 | Sahin et al. | |
| 6,469,283 B1 * | 10/2002 | Burkhart et al. | 219/486 |
| 6,475,336 B1 | 11/2002 | Hubacek | |
| 6,481,886 B1 * | 11/2002 | Narendrnath et al. | 374/141 |
| 6,486,447 B2 * | 11/2002 | Miyata | 219/444.1 |
| 6,494,958 B1 * | 12/2002 | Shamouilian et al. | 118/728 |
| 6,506,291 B2 | 1/2003 | Tsai et al. | |
| 6,507,006 B1 * | 1/2003 | Hiramatsu et al. | 219/444.1 |
| 6,524,432 B1 | 2/2003 | Collins et al. | |
| 6,535,372 B2 | 3/2003 | Parkhe et al. | |
| 6,538,872 B1 | 3/2003 | Wang et al. | |
| 6,538,873 B1 * | 3/2003 | Larsen | 361/234 |
| 6,554,906 B1 * | 4/2003 | Kuibira et al. | 118/725 |
| 6,558,158 B2 * | 5/2003 | Yamaguchi | 432/258 |
| 6,563,686 B2 | 5/2003 | Tsai et al. | |
| 6,572,732 B2 | 6/2003 | Collins | |
| 6,579,730 B2 | 6/2003 | Li et al. | |
| 6,586,886 B1 | 7/2003 | Katz et al. | |
| 6,605,955 B1 * | 8/2003 | Costello et al. | 324/750.09 |
| 6,607,640 B2 | 8/2003 | Sundarrajan et al. | |
| 6,623,596 B1 | 9/2003 | Collins et al. | |
| 6,632,512 B1 * | 10/2003 | Ito | 428/210 |
| 6,646,233 B2 * | 11/2003 | Kanno et al. | 219/390 |
| 6,652,713 B2 | 11/2003 | Brown et al. | |
| 6,664,738 B2 * | 12/2003 | Arai et al. | 315/111.21 |
| 6,693,030 B1 | 2/2004 | Subrahmanyan et al. | |
| 6,710,307 B2 * | 3/2004 | Ito et al. | 219/444.1 |
| 6,717,116 B1 | 4/2004 | Ito et al. | 219/444.1 |
| 6,740,853 B1 * | 5/2004 | Johnson et al. | 219/444.1 |
| 6,753,601 B2 * | 6/2004 | Hiramatsu et al. | 257/703 |
| 6,768,627 B1 | 7/2004 | Kitabayashi et al. | |
| 6,793,767 B2 | 9/2004 | Chu et al. | |
| 6,815,646 B2 * | 11/2004 | Ito et al. | 219/444.1 |
| 6,838,833 B2 * | 1/2005 | Arai et al. | 315/111.21 |
| 6,847,014 B1 * | 1/2005 | Benjamin et al. | 219/444.1 |
| 6,853,533 B2 | 2/2005 | Parkhe | |
| 6,863,020 B2 | 3/2005 | Mitrovic et al. | |
| 6,875,960 B2 * | 4/2005 | Yamaguchi et al. | 219/462.1 |
| 6,878,907 B2 * | 4/2005 | Hiramatsu et al. | 219/444.1 |
| 6,884,972 B2 * | 4/2005 | Ito et al. | 219/444.1 |
| 6,888,236 B2 * | 5/2005 | Hiramatsu et al. | 257/703 |
| 6,891,263 B2 * | 5/2005 | Hiramatsu et al. | 257/703 |
| 6,900,149 B1 * | 5/2005 | Ito et al. | 501/98.4 |
| 6,916,399 B1 | 7/2005 | Rozenzon et al. | |
| 6,921,881 B2 * | 7/2005 | Ito et al. | 219/145.22 |
| 6,924,464 B2 * | 8/2005 | Zhou et al. | 219/444.1 |
| 6,929,874 B2 * | 8/2005 | Hiramatsu et al. | 428/698 |
| 6,936,343 B1 * | 8/2005 | Hiramatsu et al. | 428/314.8 |
| 6,946,403 B2 * | 9/2005 | Kellerman et al. | 438/758 |
| 6,949,722 B2 * | 9/2005 | Strang et al. | 219/444.1 |
| 6,951,587 B1 * | 10/2005 | Narushima | 118/728 |
| 7,011,874 B2 * | 3/2006 | Ito et al. | 428/64.1 |
| 7,015,166 B2 * | 3/2006 | Ito et al. | 501/98.4 |
| 7,029,529 B2 | 4/2006 | Law et al. | |
| 7,033,444 B1 * | 4/2006 | Komino et al. | 118/725 |
| 7,071,551 B2 * | 7/2006 | Hiramatsu et al. | 257/710 |
| 7,072,165 B2 * | 7/2006 | Kellerman et al. | 361/234 |
| 7,084,376 B2 * | 8/2006 | Ito et al. | 219/444.1 |
| 7,085,616 B2 | 8/2006 | Chin et al. | |
| 7,170,142 B2 | 1/2007 | Wojcik et al. | |
| 7,175,737 B2 | 2/2007 | Sago et al. | |
| 7,196,283 B2 | 3/2007 | Buchberger et al. | |
| 7,221,553 B2 * | 5/2007 | Nguyen et al. | 361/234 |
| 7,248,456 B2 * | 7/2007 | Nakamura | 361/234 |
| 7,347,901 B2 * | 3/2008 | Fink et al. | 118/724 |
| RE40,264 E | 4/2008 | Flamm | |
| 7,436,645 B2 * | 10/2008 | Holland et al. | 361/234 |
| 7,457,098 B2 * | 11/2008 | Nakamura | 361/234 |
| 7,586,734 B2 * | 9/2009 | Kamitani et al. | 361/234 |
| 7,623,334 B2 * | 11/2009 | Mizuno et al. | 361/234 |
| 7,648,914 B2 * | 1/2010 | Kropewnicki et al. | 438/689 |
| 7,649,729 B2 * | 1/2010 | Buchberger et al. | 361/234 |

(56) References Cited

U.S. PATENT DOCUMENTS

| | | | |
|---|---|---|---|
| 7,663,860 B2 | 2/2010 | Nishimoto et al. | |
| 7,667,944 B2 * | 2/2010 | Naim | 361/234 |
| 7,697,260 B2 * | 4/2010 | Brown et al. | 361/234 |
| 7,705,275 B2 * | 4/2010 | Umotoy et al. | 219/401 |
| 7,723,648 B2 * | 5/2010 | Tsukamoto et al. | 219/390 |
| 7,763,831 B2 * | 7/2010 | Morioka et al. | 219/444.1 |
| 7,777,152 B2 * | 8/2010 | Todorov et al. | 219/121.54 |
| 7,907,384 B2 * | 3/2011 | Brown et al. | 361/234 |
| 8,012,304 B2 * | 9/2011 | Brillhart et al. | 156/345.27 |
| 8,226,769 B2 * | 7/2012 | Matyushkin et al. | 118/728 |
| 8,405,005 B2 * | 3/2013 | Zucker et al. | 219/444.1 |
| 2001/0017205 A1 | 8/2001 | Ikeda | |
| 2001/0019472 A1 * | 9/2001 | Kanno et al. | 361/234 |
| 2001/0025783 A1 | 10/2001 | Sundarrajan et al. | |
| 2001/0052359 A1 | 12/2001 | Ikeda | |
| 2001/0054389 A1 | 12/2001 | Sago et al. | |
| 2002/0021545 A1 | 2/2002 | Tatsumi et al. | |
| 2002/0050246 A1 | 5/2002 | Parkhe | |
| 2002/0113056 A1 | 8/2002 | Sugaya et al. | |
| 2002/0157611 A1 | 10/2002 | Bondestam et al. | |
| 2002/0170882 A1 | 11/2002 | Akiba | |
| 2003/0107866 A1 | 6/2003 | Lee et al. | |
| 2003/0155079 A1 | 8/2003 | Bailey et al. | |
| 2003/0160568 A1 * | 8/2003 | Arai et al. | 315/111.21 |
| 2003/0164226 A1 | 9/2003 | Kanno et al. | |
| 2003/0198005 A1 | 10/2003 | Sago et al. | |
| 2003/0215962 A1 | 11/2003 | Hausmann et al. | |
| 2003/0230551 A1 | 12/2003 | Kagoshima et al. | |
| 2004/0040665 A1 * | 3/2004 | Mizuno et al. | 156/345.51 |
| 2004/0061449 A1 | 4/2004 | Arai et al. | |
| 2004/0074586 A1 * | 4/2004 | Hiramatsu et al. | 156/89.11 |
| 2004/0115947 A1 * | 6/2004 | Fink et al. | 438/716 |
| 2004/0185670 A1 | 9/2004 | Hamelin et al. | |
| 2004/0187787 A1 | 9/2004 | Dawson et al. | |
| 2004/0187791 A1 | 9/2004 | Busse et al. | |
| 2004/0195216 A1 | 10/2004 | Strang | |
| 2004/0200498 A1 | 10/2004 | Wang et al. | |
| 2004/0218339 A1 * | 11/2004 | Nakamura | 361/234 |
| 2004/0226515 A1 * | 11/2004 | Yendler et al. | 118/728 |
| 2004/0261721 A1 | 12/2004 | Steger | |
| 2005/0000937 A1 | 1/2005 | Chiang et al. | |
| 2005/0016986 A1 * | 1/2005 | Ito | 219/444.1 |
| 2005/0041364 A1 | 2/2005 | Kellerman et al. | |
| 2005/0042881 A1 * | 2/2005 | Nishimoto et al. | 438/710 |
| 2005/0173410 A1 | 8/2005 | Okajima et al. | |
| 2005/0183669 A1 | 8/2005 | Parkhe et al. | |
| 2005/0207088 A1 | 9/2005 | Nishimoto et al. | |
| 2005/0229854 A1 | 10/2005 | Moroz | |
| 2005/0230047 A1 | 10/2005 | Collins et al. | |
| 2006/0023395 A1 | 2/2006 | Hsiao et al. | |
| 2006/0076108 A1 * | 4/2006 | Holland et al. | 156/345.27 |
| 2006/0076109 A1 * | 4/2006 | Holland et al. | 156/345.27 |
| 2006/0090855 A1 | 5/2006 | Kimura | |
| 2006/0137607 A1 | 6/2006 | Seo et al. | |
| 2006/0158821 A1 | 7/2006 | Miyashita | |
| 2006/0219360 A1 | 10/2006 | Iwasaki | |
| 2006/0254717 A1 * | 11/2006 | Kobayashi et al. | 156/345.44 |
| 2006/0274298 A1 | 12/2006 | Akaike | |
| 2007/0040041 A1 | 2/2007 | Le et al. | |
| 2007/0081294 A1 | 4/2007 | Buchberger et al. | |
| 2007/0081296 A1 | 4/2007 | Brillhart et al. | |
| 2007/0091537 A1 | 4/2007 | Buchberger et al. | |
| 2007/0102118 A1 | 5/2007 | Holland et al. | |
| 2007/0139856 A1 | 6/2007 | Holland et al. | |
| 2007/0251456 A1 | 11/2007 | Herchen et al. | |
| 2007/0256785 A1 | 11/2007 | Pamarthy et al. | |
| 2007/0256786 A1 | 11/2007 | Zhou et al. | |
| 2007/0258186 A1 * | 11/2007 | Matyushkin et al. | 361/234 |
| 2008/0014363 A1 | 1/2008 | Sago et al. | |
| 2008/0017104 A1 * | 1/2008 | Matyushkin et al. | 118/696 |
| 2008/0083723 A1 * | 4/2008 | Tsukamoto et al. | 219/385 |
| 2008/0089001 A1 * | 4/2008 | Parkhe et al. | 361/234 |
| 2008/0142208 A1 | 6/2008 | Ranish et al. | |
| 2008/0276958 A1 | 11/2008 | Mehta et al. | |
| 2009/0277883 A1 * | 11/2009 | Tandou et al. | 219/121.49 |
| 2010/0039747 A1 * | 2/2010 | Sansoni et al. | 361/234 |
| 2010/0078424 A1 * | 4/2010 | Tsukamoto et al. | 219/444.1 |

FOREIGN PATENT DOCUMENTS

| | | | |
|---|---|---|---|
| CN | 1779939 A | 5/2006 | |
| EP | 0 123 456 | 10/1984 | |
| JP | 58-71626 | 4/1983 | |
| JP | 59086235 | 5/1984 | |
| JP | 59086235 A * | 5/1984 | H01L 21/66 |
| JP | 62-150839 | 7/1987 | |
| JP | 4-238882 | 8/1992 | |
| JP | 07-153822 | 6/1995 | |
| JP | 2002-170753 | 8/1995 | |
| JP | 9-17770 | 1/1997 | |
| JP | 09-045624 | 2/1997 | |
| JP | 9-45757 | 2/1997 | |
| JP | 09097830 | 4/1997 | |
| JP | 09097830 A * | 4/1997 | H01L 21/68 |
| JP | 10-209257 | 8/1998 | |
| JP | 10-270540 | 10/1998 | |
| JP | 10-303286 | 11/1998 | |
| JP | 11-163109 | 6/1999 | |
| JP | 11-176919 | 7/1999 | |
| JP | 2001-351967 | 12/2001 | |
| JP | 2002-076105 | 3/2002 | |
| JP | 2002-222849 | 8/2002 | |
| JP | 2004-006813 | 1/2004 | |
| JP | 2004-282047 | 7/2004 | |
| JP | 2005-101505 | 4/2005 | |
| JP | 2005-191561 | 7/2005 | |
| TW | 200509291 | 3/2005 | |
| WO | WO01/41508 | 6/2001 | |
| WO | WO-02/17384 | 2/2002 | |
| WO | WO-02/082511 | 10/2002 | |
| WO | WO-2007041668 | 4/2007 | |
| WO | WO-2008/140982 | 11/2008 | |

OTHER PUBLICATIONS

Kropewnicki et al., "Temperature dependence of the sticking coefficient of etch by-products . . . ", U.S. Appl. No. 60/658,698, filed Mar. 3, 2005.

Matyushkin et al., "Substrate processing with rapid temperature gradient control", U.S. Appl. No. 60/832,545, filed Jul. 20, 2006.

Waits, R.K. "Monitoring residual and process gases in PVD processes: The importance of sen . . . ", Micromagazine, Jun. 1997, http://www.micromagazine.com/archive/97/06/waits.html.

Office Action dated Oct. 23, 2009 in Chinese Appl. No. 2007100976540.0, entitled "Substrate support with electrostatic chuck having dual temperature zones", Beijing (CN).

Office Action dated Sep. 28, 2011 in U.S. Appl. No. 11/740,869, entitled "Substrate Support With Electrostatic Chuck Having Dual Temperature Zones".

Office Action dated Jun. 18, 2010 in U.S. Appl. No. 11/740,869, entitled "Substrate Support With Electrostatic Chuck Having Dual Temperature Zones".

Final Office Action dated Dec. 29, 2010 in U.S. Appl. No. 11/740,869, entitled "Substrate Support With Electrostatic Chuck Having Dual Temperature Zones".

Advisory Action dated Mar. 16, 2011 in U.S. Appl. No. 11/740,869, entitled "Substrate Support With Electrostatic Chuck Having Dual Temperature Zones".

\* cited by examiner

FIG. 4C1

ELECTROSTATIC CHUCK HAVING A PLURALITY OF HEATER COILS

CROSS-REFERENCE

This application is a continuation of U.S. patent application Ser. No. 11/740,869, filed Apr. 26, 2007 now U.S. Pat. No. 8,226,769, which claims priority to U.S. Provisional Application Ser. No. 60/796,013, filed Apr. 27, 2006, both of which are incorporated by reference herein and in their entirety.

BACKGROUND

Embodiments of the present invention relate to a substrate support for holding a substrate in a substrate processing chamber.

In the processing of substrates, such as semiconductors and displays, an electrostatic chuck is used to hold a substrate in a substrate processing chamber. A typical electrostatic chuck comprises an electrode covered by a dielectric, such as ceramic or polymer. When the electrode is electrically charged, electrostatic charges in the electrode and substrate holds the substrate on the chuck. Typically, the temperature of the substrate is controlled by providing a gas behind the substrate to enhance heat transfer rates across the microscopic gaps between the substrate and the surface of the chuck. The electrostatic chuck can be supported by a base which has channels for passing a fluid therethrough to cool or heat the chuck. Once a substrate is securely held on the chuck, process gas is introduced into the chamber and a plasma is formed to process the substrate by CVD, PVD, etch, implant, oxidation, nitridation, or other processes.

During processing, a substrate is often subjected to non-uniform processing rates or other processing properties across the substrate surface. For example, such non-uniform processing can give rise to concentric processing bands in the radial direction across the substrate surface. Non-uniform processing can also result from the distribution of gas species or plasma species in the chamber. For example, the distribution of gas across the chamber can vary depending on the location of the inlet gas ports and exhaust ports in the chamber relative to the substrate surface. Also, mass transport mechanisms can alter the rates of arrival and dissipation of gaseous species at different regions of the substrate surface. Variability in processing rates can also arise from non-uniform heat loads occurring in the chamber. Such variable heat loads can also occur, for example, due to non-uniform coupling of energy from the plasma sheath to the substrate or radiant heat reflected from chamber walls. Such processing variability across the substrate is undesirable as the active and passive electronic devices being fabricated at different regions of the substrate, for example, the peripheral and central substrate regions, can have different properties.

Accordingly, it is desirable to reduce the variations in processing rates and other process characteristics across the substrate surface during processing. It can also be desirable to control temperatures at different regions across the processing surface of the substrate. It is further desirable to control a temperature and gas distribution profile across the substrate during its processing.

SUMMARY

An electrostatic chuck for receiving a substrate in a substrate processing chamber comprises a ceramic puck having a substrate receiving surface having a plurality of spaced apart mesas, an opposing backside surface, and central and peripheral portions. A plurality of heat transfer gas conduits traverse the ceramic puck and terminate in ports on the substrate receiving surface to provide heat transfer gas to the substrate receiving surface. An electrode is embedded in the ceramic puck to generate an electrostatic force to retain a substrate placed on the substrate receiving surface. A plurality of heater coils are also embedded in the ceramic puck, the heaters being radially spaced apart and concentric to one another.

DRAWINGS

These features, aspects, and advantages of the present invention will become better understood with regard to the following description, appended claims, and accompanying drawings, which illustrate examples of the invention. However, it is to be understood that each of the features can be used in the invention in general, not merely in the context of the particular drawings, and the invention includes any combination of these features, where:

Figure 1:
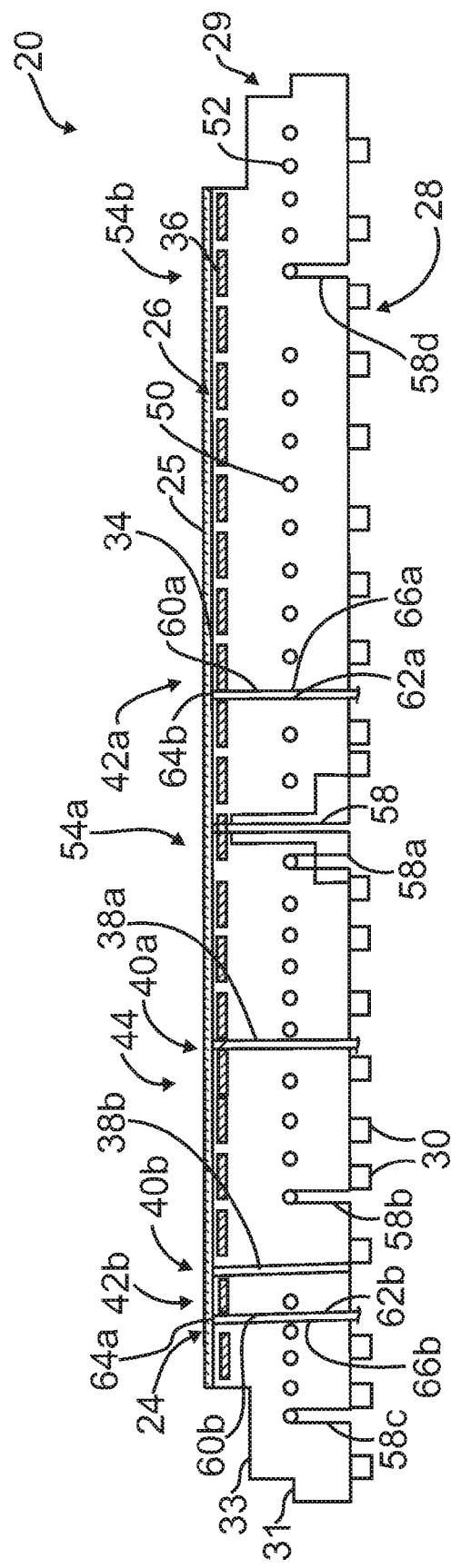
FIG. 1 is a schematic sectional side view of an embodiment of an electrostatic chuck.
Figure 4A:
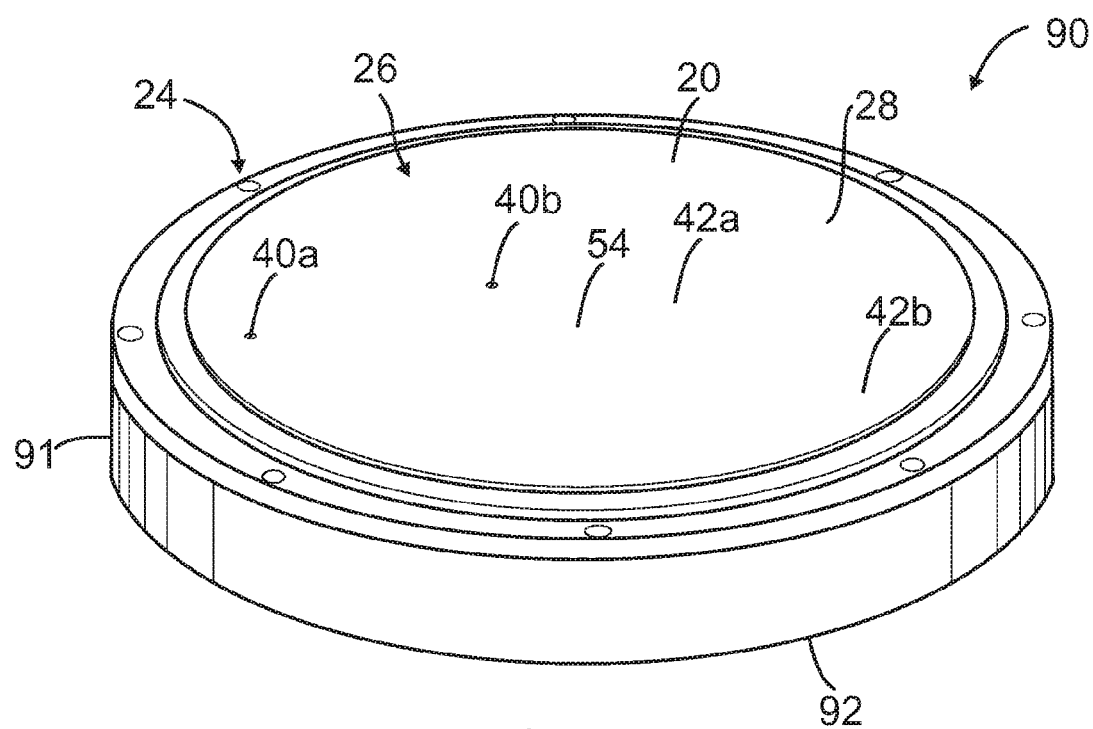
FIGS. 4A and 4B are schematic perspective views of the top (FIG. 4A) and bottom (FIG. 4B) of an embodiment of a substrate support comprising a base and electrostatic chuck.
Figure 4B:
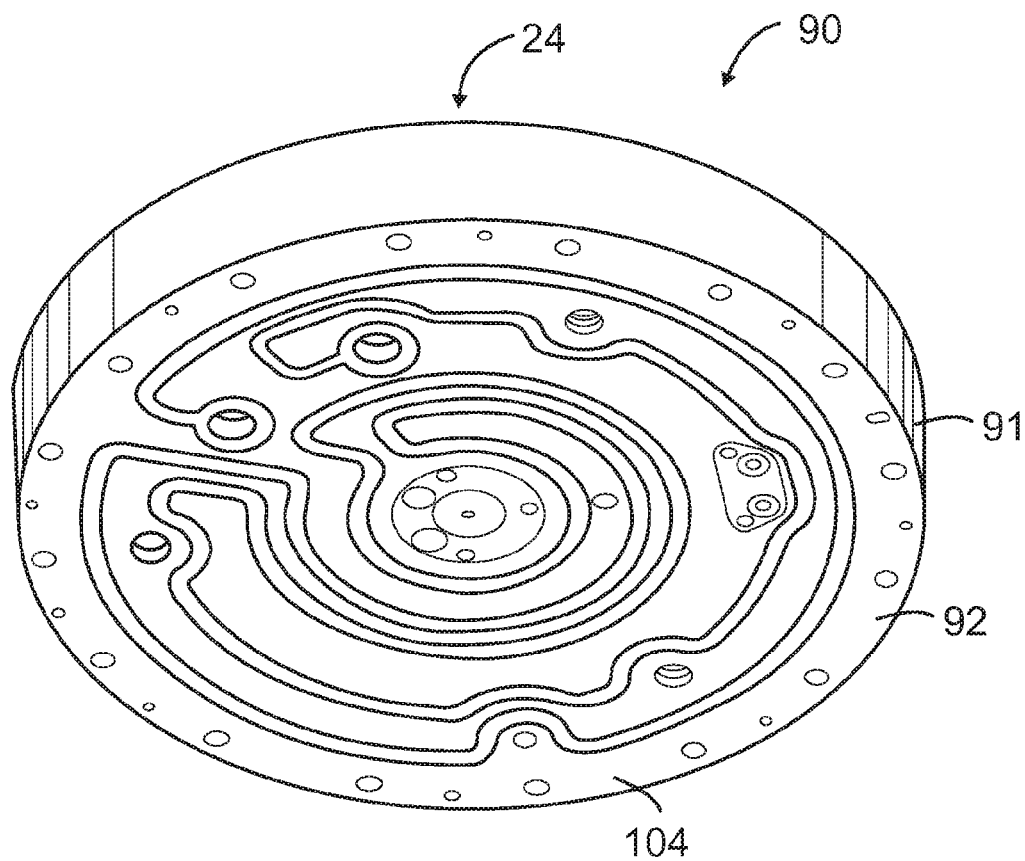
Figure 4C:
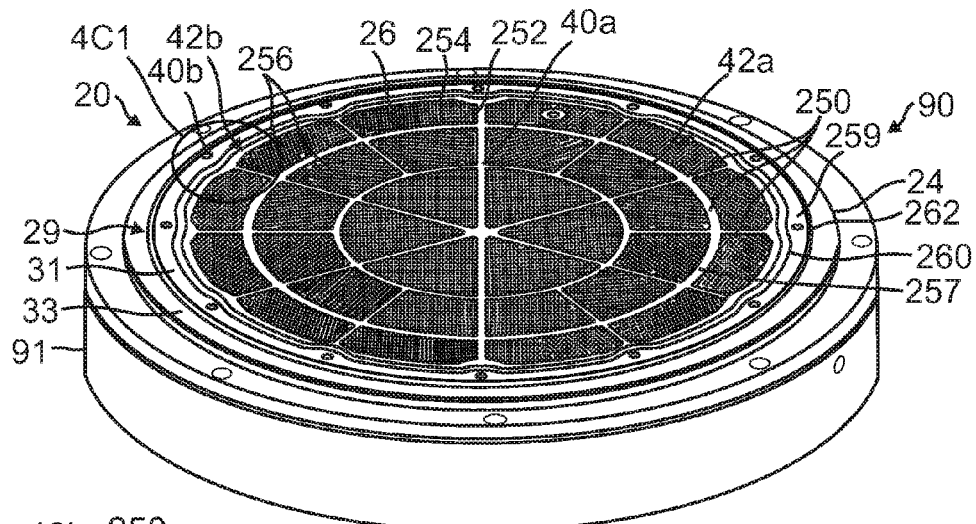
FIG. 4C is a schematic perspective top view of another embodiment of a substrate support comprising a base and electrostatic chuck.
Figure 4D:
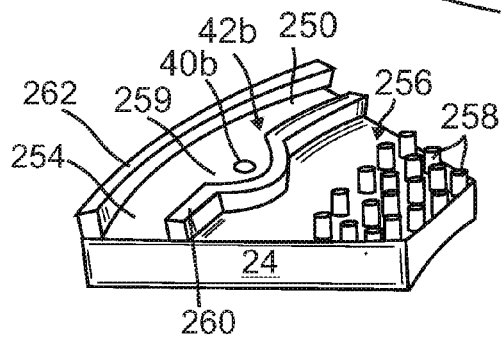
Figure 4D:
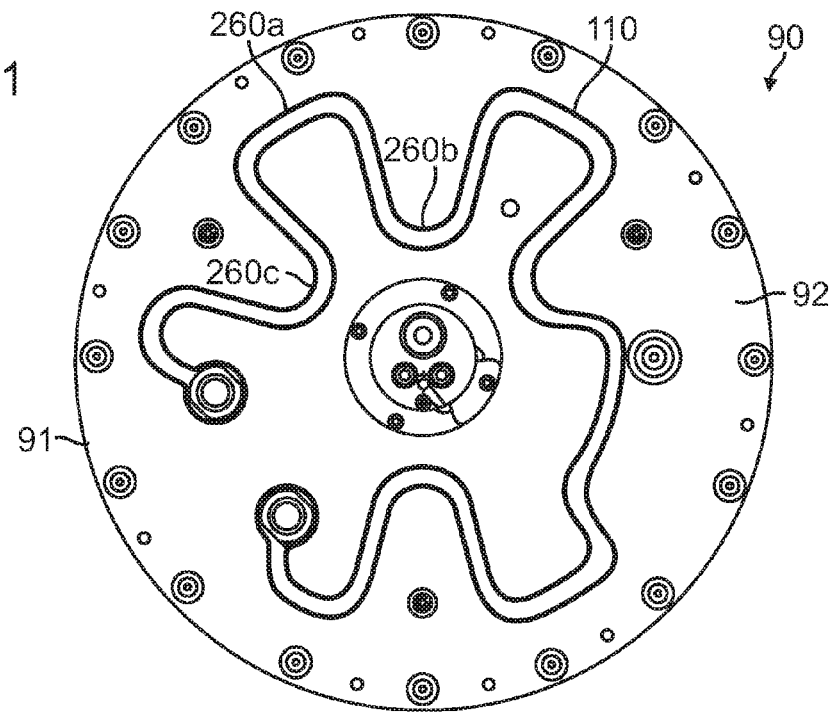
Figure 5A:
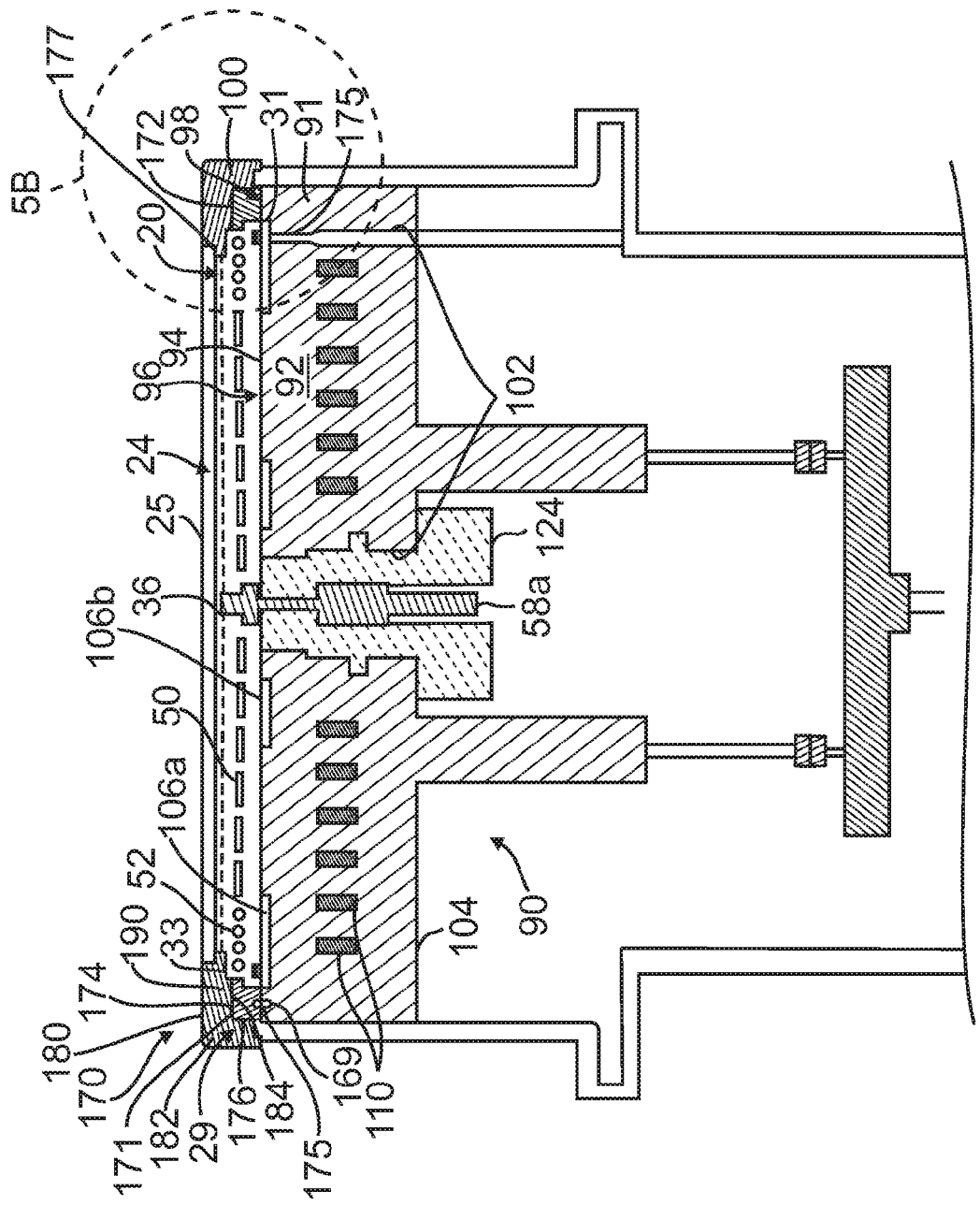
Figure 5B:
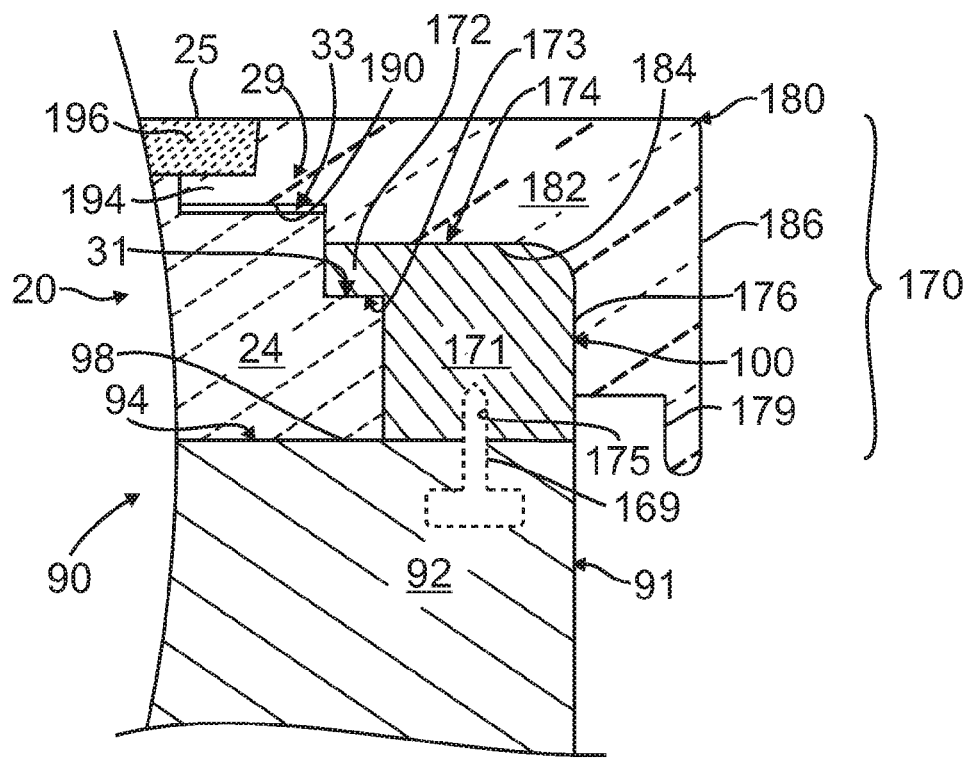
Figure 5C:
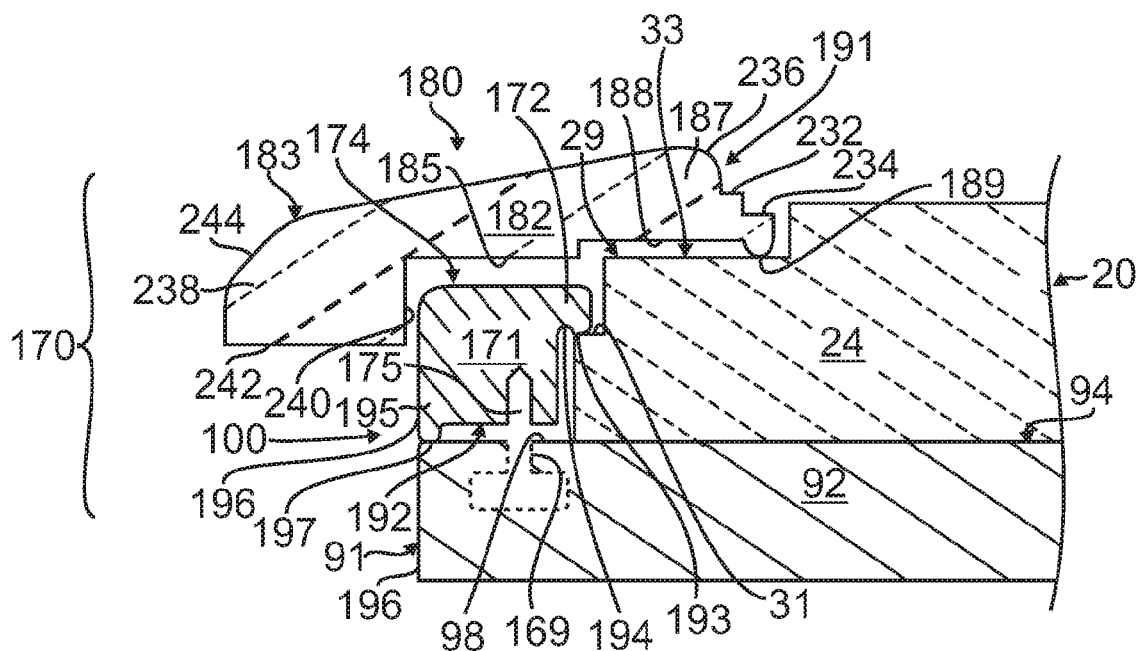
Figure 6:
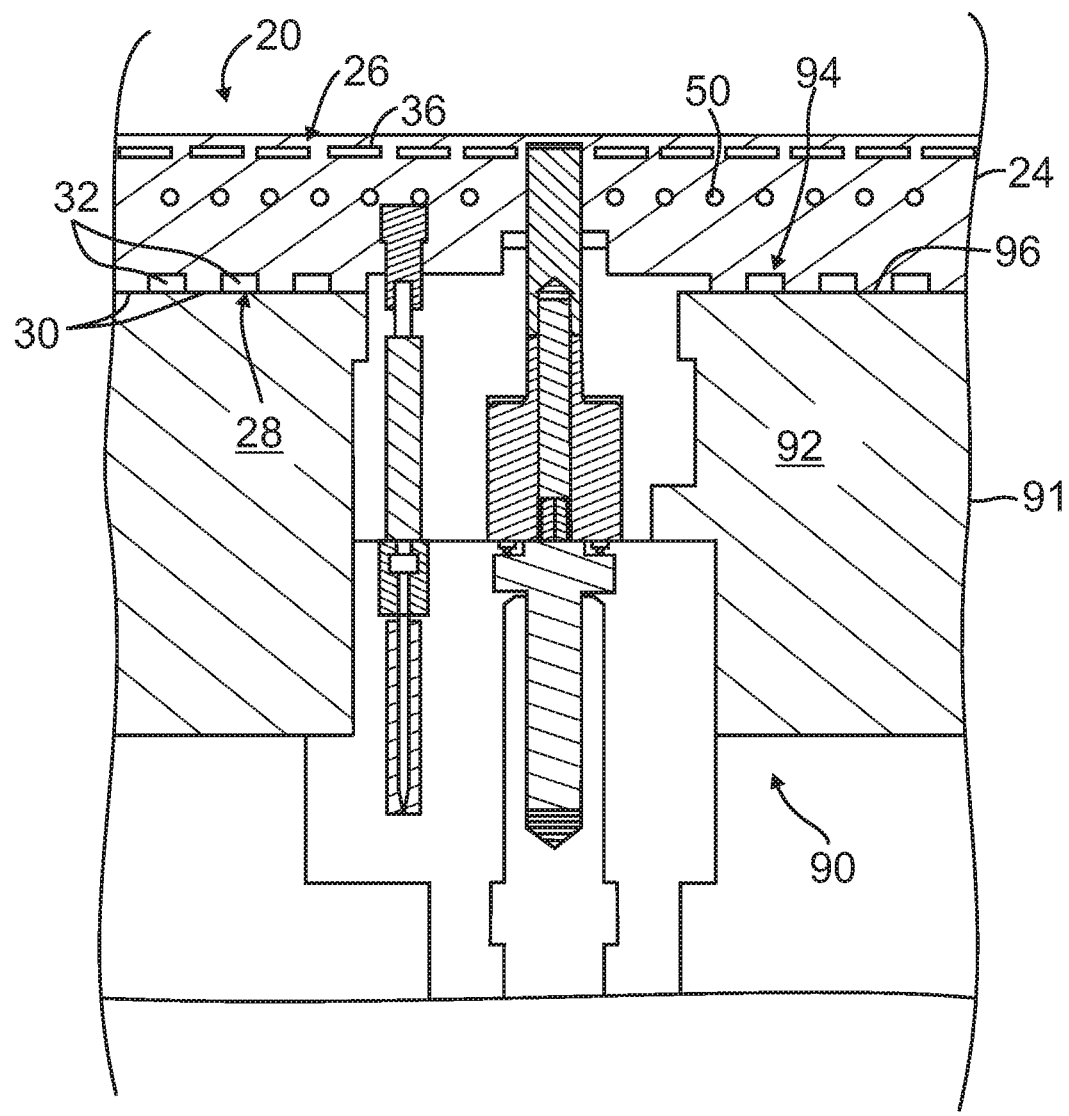
Figure 7:
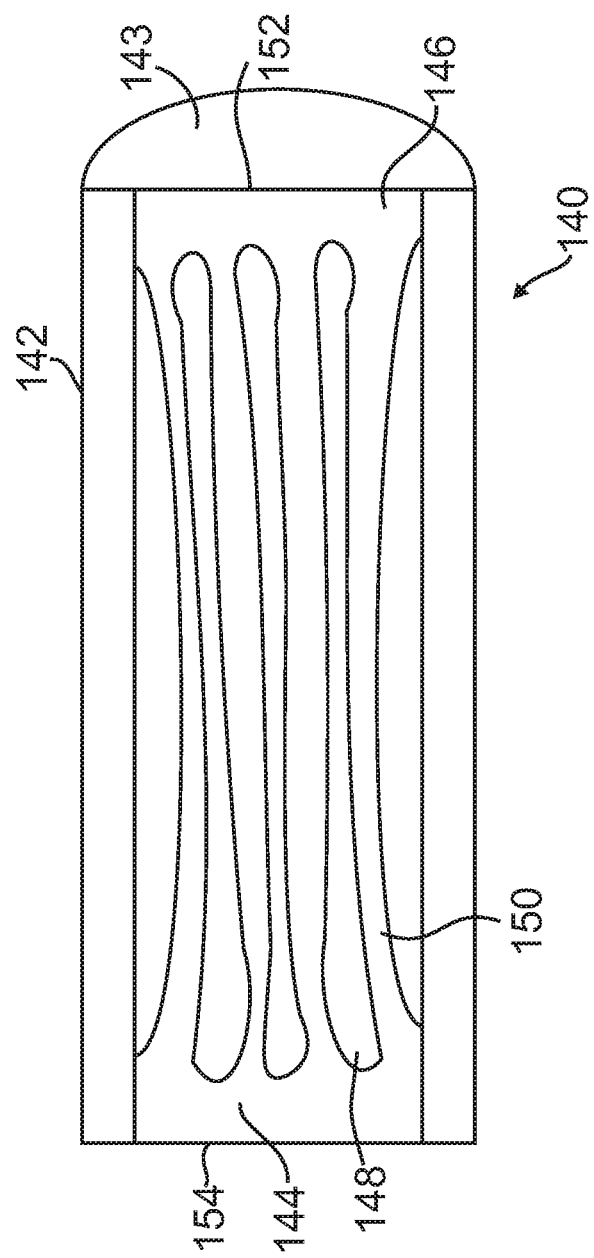
Figure 8:
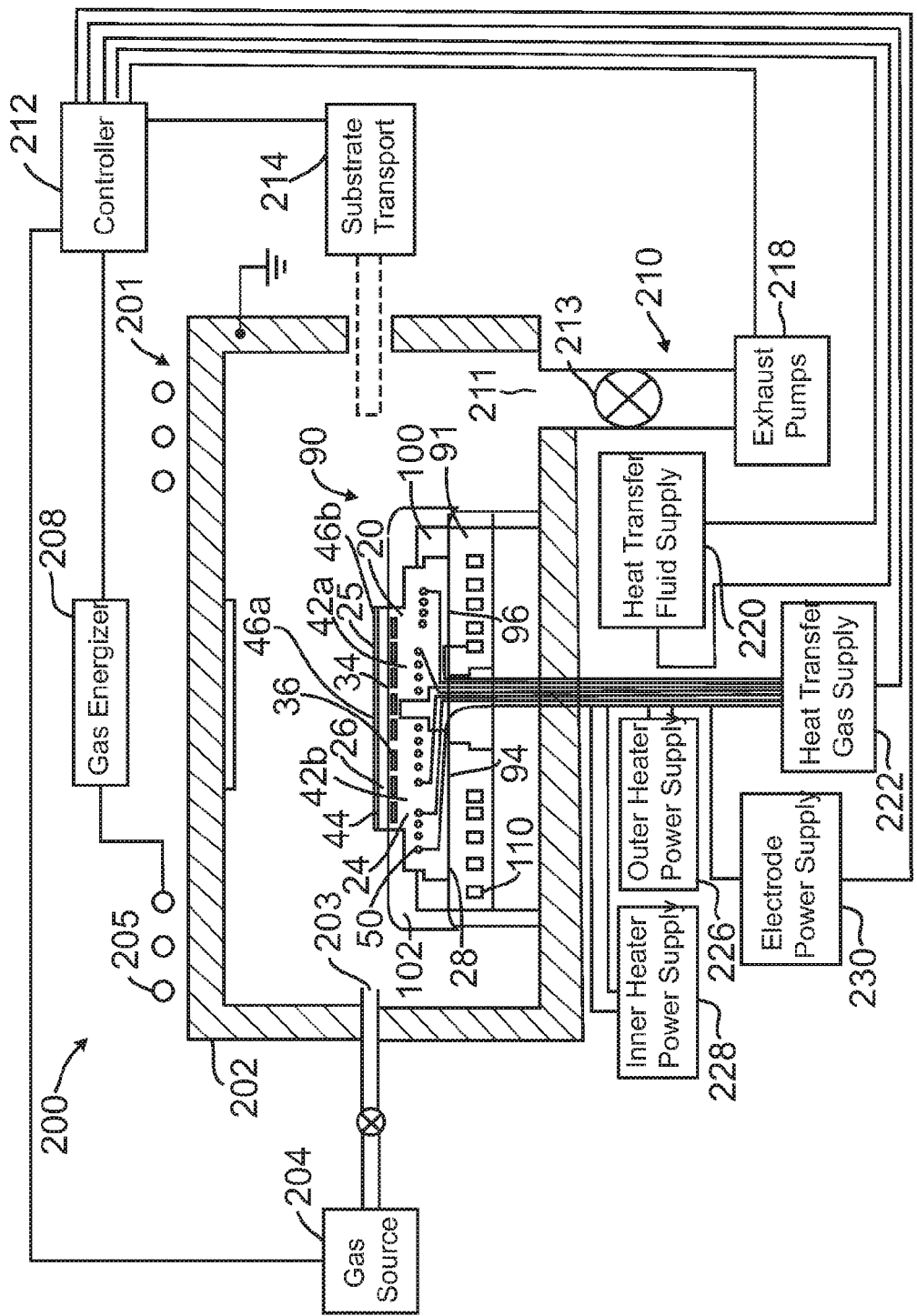

FIG. 4C1 is perspective detailed view of circled section 4C1 of FIG. 4C, showing a peripheral zone with a peripheral port and surrounding sealing rims;

FIG. 4D is a bottom plan view of the base of the support of FIG. 4C;

FIG. 5A is a schematic sectional side view of an embodiment of a ring assembly comprising an edge ring over a clamp ring on the substrate support of FIGS. 4A and 4B;

FIG. 5B is a detailed view of the ring assembly of FIG. 5A;

FIG. 5C is a schematic sectional side view of another embodiment of a ring assembly comprising an edge ring over a clamp ring on a substrate support;

FIG. 6 is schematic sectional side view of an embodiment of an electrical connector assembly of a base;

FIG. 7 is schematic sectional side view of an embodiment of an contact band; and FIG. 8 is a schematic side view of an embodiment of a substrate processing chamber with the substrate support.

DESCRIPTION

An embodiment of an electrostatic chuck 20 comprises a ceramic puck 24 comprising a ceramic body having a substrate receiving surface 26 that is the top surface of the puck 24 and which serves to hold a substrate 25, as shown in FIG. 1. The ceramic puck 24 also has a backside surface 28 opposing the substrate receiving surface 26. The ceramic puck 24 further has a peripheral ledge 29 having a first step 31 and a second step 33, the second step 33 being radially outward from, and lower than, the first step 31. The ceramic puck 24 comprises at least one of aluminum oxide, aluminum nitride, silicon oxide, silicon carbide, silicon nitride, titanium oxide, zirconium oxide, and mixtures thereof. The ceramic puck 24 can be unitary monolith of ceramic made by hot pressing and sintering a ceramic powder, and then machining the sintered form to form the final shape of the puck 24.

Figure 2:
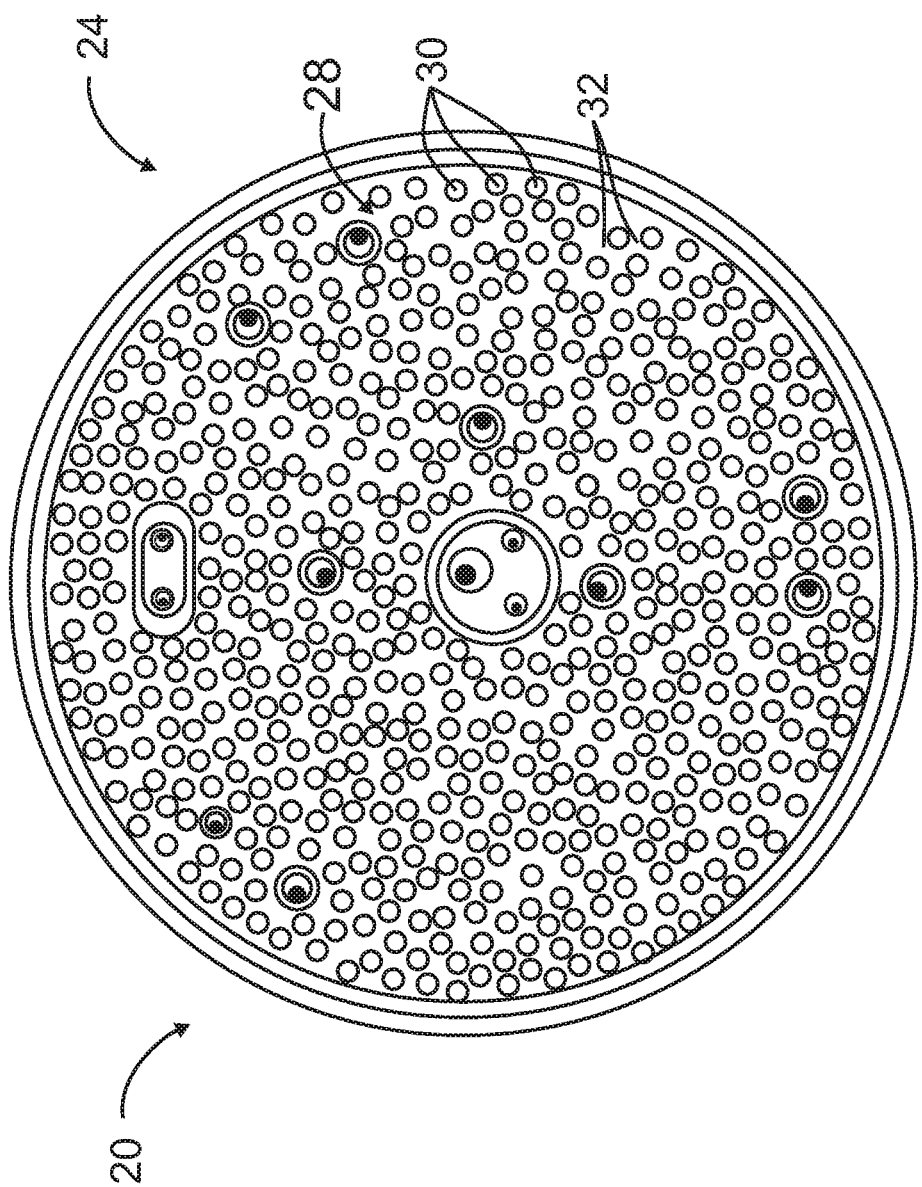
FIG. 2 is a schematic bottom view of the chuck of FIG. 1.

In one version, as shown in FIGS. 1 and 2, the backside surface 28 of the ceramic puck 24 comprises a plurality of spaced apart mesas 30 which are each cylindrical mounds that are separated from each other by a plurality of gaps 32. In use, the gaps 32 are filled with a gas, such as air, to regulate the heat transfer rates from the backside surface 28 to other underlying surfaces of other structures. In one embodiment, the mesas 30 comprise cylindrical mounds, which can even be shaped as posts, that extend up from the surface 28, the posts having a rectangular or circular cross-sectional shape. The height of the mesas 30 can be from about 10 to about 50 microns, and the width (or diameter) of the mesas 30 from about 500 to about 5000 microns. However, the mesas 30 can also have other shapes and sizes, for example, cones or rectangular blocks, or even bumps of varying sizes. In one version, the mesas 30 are formed by bead blasting the backside surface 28 with a bead size that is suitably small, for example, in the tens of microns, to etch away by erosion the material of the backside surface 28 to form the shaped mesas 30 with the intervening gaps 32.

The ceramic puck 24 also comprises an electrode 36 embedded therein to generate an electrostatic force to retain a substrate placed on the substrate receiving surface 26. The electrode 36 is a conductor, such as a metal, and be shaped as a monopolar or bipolar electrode. Monopolar electrodes comprise a single conductor and have a single electrical connection to an external electrical power source and cooperate with the charged species of the overlying plasma formed in a chamber to apply an electrical bias across the substrate held on the chuck 20. Bipolar electrodes have two or more conductors, each of which is biased relative to the other to generate an electrostatic force to hold a substrate. The electrode 36 can be shaped as a wire mesh or a metal plate with suitable cut-out regions. For example, an electrode 36 comprising a monopolar electrode can be a single continuous wire mesh embedded in the ceramic puck as shown. An embodiment of an electrode 36 comprising a bipolar electrode can be a pair of filled-in C-shaped plates that face one another across the straight leg of the C-shape. The electrode 36 can be composed of aluminum, copper, iron, molybdenum, titanium, tungsten, or alloys thereof. One version of the electrode 36 comprises a mesh of molybdenum. The electrode 36 is connected to a terminal post 58 which supplies electrical power to the electrode 36 from an external power supply.

The ceramic puck 24 also has a plurality of heat transfer gas conduits 38a,b that traverse the ceramic body and terminating in ports 40a,b on the substrate receiving surface 26 to provide heat transfer gas to the substrate receiving surface 26. The heat transfer gas, which can be for example, helium, is supplied below the substrate backside 34 to conduct heat away from the overlying substrate 25 and to the receiving surface 26 of the ceramic puck 24. For example, a first gas conduit 38a can be located to supply heat transfer gas to a central heating zone 42a of the substrate receiving surface 26, and a second gas conduit 38b can be located to supply heat transfer gas to a peripheral heating zone 42b of the substrate receiving surface 26. The central and peripheral heating zones 42a,b of the substrate receiving surface 26 of the ceramic puck 24 allow corresponding portions of the substrate process surface 44, for example, the overlying central and peripheral portions 46a,b of the substrate 25, respectively, to be maintained at different temperatures.

The temperatures at the central and peripheral heating zones 42a,b of the substrate receiving surface 26 of the ceramic puck 24 are further controlled using a plurality of heater coils 50, 52, for example, a first heater coil 50 and a second heater coil 52, embedded in the ceramic puck 24. For example, the heater coils 50, 52 can be radially spaced apart and concentric about one another, and even side by side and in the same plane. In one version, the first heater coil 50 is located at a central portion 54a of the ceramic puck 24 and the second heater coil 52 located at a peripheral portion 54b of the ceramic puck 24. The first and second heater coils 50, 52 allow independent control of the temperatures of the central and peripheral portions 54a, 54b of the ceramic puck 24, and further cooperate with the mesas 30 on the backside surface 28 of the ceramic puck 24 to allow regulation of a temperature profile of a substrate 25 placed on the receiving surface 26 of the ceramic puck 24.

Each heater coil 50, 52 provides the ability to independently control the temperatures of the heating zones 42a,b, to achieve different processing rates or characteristics across the radial direction of the processing surface 44 of the substrate 25. As such, different temperatures can be maintained at the two heating zones 42a,b to affect the temperatures of the overlying central and peripheral portions 46a,b of the substrate 25, thereby counteracting any variable gas species distribution or heat load occurring during processing of the substrate 25. For example, when gas species at the peripheral portion 46b of the processing surface 44 of the substrate 25 are less active than those at the central portion 46a, the temperature of the peripheral heating zone 42b is elevated to a higher temperature than the central heating zone 42a to provide a more uniform processing rates or process characteristics across the processing surface 44 of the substrate 25.

In one version, the first and second heater coils 50, 52 each comprise circular loops of resistive heating elements that are arranged side by side, and can even be substantially in the same plane. For example, the heater coils 50, 52 can each be a continuous concentric loop that gradually spirals radially inward in the body of the ceramic puck 24. The heater coils 50, 52 can also be spiral coils that spiral about an axis passing through the center of the coils, for example, like a light bulb filament, which are positioned in concentric circles across the inside volume of the ceramic puck 24. The resistive heating elements can be composed of different electrically resistive materials, such as for example, molybdenum. In one version, the heater coils 50, 52 each comprise an electrical resistance sufficiently high to maintain the substrate receiving surface 26 of the ceramic puck 24 at temperatures of from about 80 to about 250° C. In this version, the electrical resistance of the coils are from about 4 to about 12 Ohms. In one example, the first heater coil 50 has an electrical resistance of 6.5 ohm and the second heater coil 52 has an electrical resistance inner of 8.5 ohm. The heater coils 50, 52 are powered via independent terminal posts 58a-d which extend through the ceramic puck 24.

In conjunction with the heater coils 50, 52, the pressure of heat transfer gas can also be controlled in the two zones 42a,b to render the substrate processing rates more uniform across the substrate 25. For example, the two zones 42a,b can each be set to hold heat transfer gas at a different equilibrated pressure to provide different heat transfer rates from the backside 34 of the substrate 25. This is accomplished by supplying heat transfer gas at two different pressures through the two conduits 38a, 38b, respectively, to exit at two different locations of the substrate receiving surface 26.

The electrostatic chuck 20 can also include optical temperature sensors 60a,b that pass through holes 62a,b in the ceramic puck 24 to contact and accurately measure the temperatures of the overlying central and peripheral portions 46a,b of the substrate 25. A first sensor 60a is positioned at the central heating zone 42a of the ceramic puck 24 to read the temperature of the central portion 46a of the substrate 25, and a second sensor 60b is positioned at the peripheral heating zone 42b of the ceramic puck 24 to correspondingly read the temperature at the peripheral portion 46b of the substrate 25. The optical temperature sensors 60a,b are positioned in the chuck 20 so that the tips 64a,b of the sensors lies in a plane with the substrate receiving surface 26 of the ceramic puck 24, such that the sensor tips 64a,b can contact the backside 34 of the substrate 25 held on the chuck 20. The legs 66a,b of the sensors 60a,b extend vertically through the body of the ceramic puck 24.

Figure 3:
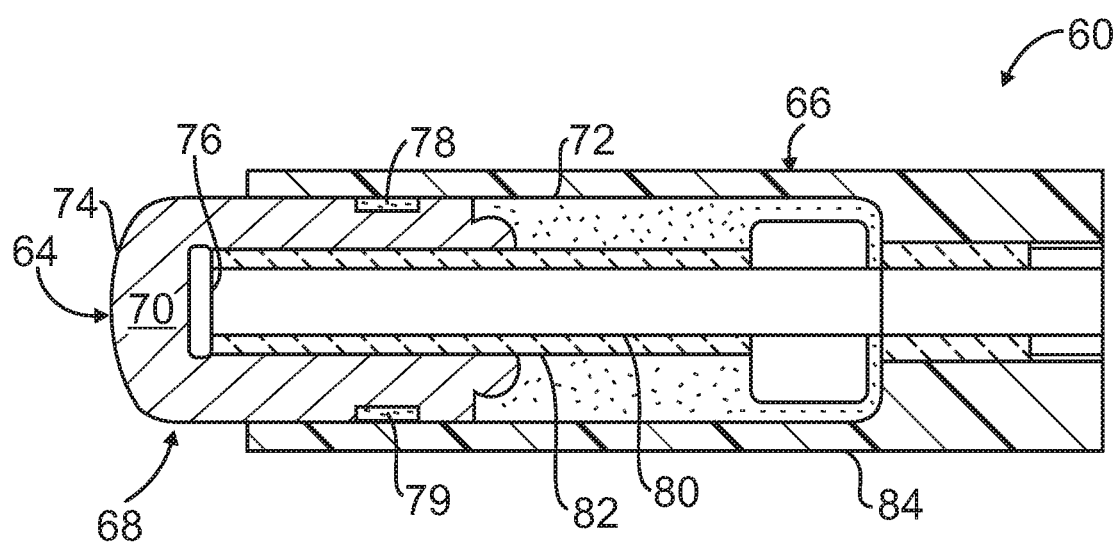
FIG. 3 is a schematic side view of an optical temperature sensor.

In one version, as shown in FIG. 3, each optical temperature sensor 60 comprises a heat sensor probe 68 comprising a copper cap 70 shaped as a closed off cylinder with a side 72 and a dome-shaped top 74 that serves as the tip 64. The copper cap 70 can be composed of oxygen free copper material. A phosphorous plug 76 is embedded inside, and in direct contact with, the top 74 of the copper cap 70. The phosphorous plug 76 embedded in the copper cap 70 provides quicker and more sensitive thermal response for the heat sensing probe 68. The tip 64 of the copper cap 70 is a dome-shaped top 74 to allow repeated contact with different substrates 25 without eroding or damaging the substrates. The copper cap 70 has a recessed groove 78 for receiving epoxy 79 to affix the cap 70 in the sensor probe 68.

The phosphorous plug 76 converts heat in the form of infrared radiation to photons which are passed though an optical fiber bundle 80. The optical fiber bundle 80 can be composed of borosilicate glass fibers. The optical fiber bundle 80 is encased by a sleeve 82, which in turn is partially surrounded by a temperature isolation jacket 84 that serves to isolate the temperature sensor from the heat of the base that supports the ceramic puck. The sleeve 82 can be a glass tubing to provide better thermal insulation from the surrounding structure, but can also be made from a metal such as copper. The temperature isolation jacket 84 may be composed of PEEK, a polyetheretherketone, and can also be Teflon® (polytetrafluoroethylene) from Dupont de Nemours Co. Delaware.

A substrate support 90 comprises the electrostatic chuck 20 secured to a base 91 which is used to support and secure the chuck 20, as shown in FIGS. 4A, 4B and 5A. The base 91 comprises a metal body 92 with a top surface 94 having a chuck receiving portion 96 and peripheral portion 98. The chuck receiving portion 96 of the top surface 94 is adapted to receive the backside surface 28 of the ceramic puck 24 of the electrostatic chuck 20. The peripheral portion 98 of the base 91 extends radially outward beyond the ceramic puck 24. The peripheral portion 98 of the base 91 can be adapted to receive a clamp ring 100 which can be secured to the top surface of the peripheral portion of the base. The metal body 92 of the base 91 has a number of passages 102 running from a bottom surface 104 of the base to the top surface 94 of the base 91, to for example, hold the terminals 58a-d or feed gas to the gas conduits 38a,b of the ceramic puck 24.

The chuck receiving portion 96 of the top surface 94 of the base 91 comprises one or more grooves 106a,b to retain and flow air across the backside of the ceramic puck 24. In one embodiment, the chuck receiving portion 96 comprises a peripheral groove 106a which cooperates with a plurality of mesas 30 on the backside surface 28 of a ceramic puck 24 to control a rate of heat transfer from the peripheral portion 54b of the ceramic puck 24. In another embodiment, a central groove 106b is used in conjunction with the peripheral groove 106a to regulate heat transfer from the central portion 54a of the ceramic puck 24.

The grooves 106a,b in the top surface 94 of the base 91 cooperate with the mesas 30 on the backside surface 28 of the ceramic puck 24 to further regulate the temperatures across the substrate processing surface 44. For example, the shape, size, and spacing of the mesas 30 control the total amount of contact surface of the mesas 30 with the top surface 94 of the base 91 thereby controlling the total heat conduction area of the interface. For example, the mesas 30 can be shaped and sized so that only 50% or less, for example 30%, of the total area of the backside surface 28 of the ceramic puck 24 actually contacts the top surface 94 of the base 91. The less the contact area, the higher the temperatures across the substrate processing surface 44. Also, air is provided between the mesas 30 and across the backside surface 28 to serve as a further temperature regulator.

The mesas 30 on the backside surface 28 of the ceramic puck 24 can be distributed across the backside surface 28 in a uniform or non-uniform pattern. In a uniform pattern, the distance between the mesas 30 as represented by the gaps 32 remain substantially the same, and in a non-uniform spacing the gaps distance varies across the surface 28. The shape and size of the mesas 30 can also be made to vary across the surface 28. For example, a non-uniform pattern of mesas 30 can be arranged to provide different amounts of contact surface across the backside surface 28 of the ceramic puck 24 at different regions, to control the heat transfer rates from the central and peripheral portions 54a,b, respectively, of the puck 24, and thus, the temperatures at the central and peripheral portions 46a,b of the overlying substrate 25.

The base 91 further comprises a plurality of channels 110 for circulating a fluid, such as water. The base 91 with the circulating cooling fluid serves as a heat exchanger to control the temperatures of the chuck 20 to achieve desired temperatures across the processing surface 44 of the substrate 25. The fluid passed through the channels 110 can be heated or cooled to raise or lower the temperature of the chuck 20 and that of the substrate 25 held on the chuck 20. In one version, the channels 110 are shaped and sized to allow fluid to flow through to maintain the base 91 at temperatures of from about 0 to 120° C.

The base 91 further comprises an electrical terminal assembly for conducting electrical power to the electrode 36 of the electrostatic chuck 20. The electrical terminal assembly comprises a ceramic insulator jacket 124 as shown in FIG. 5A. The ceramic insulator jacket 124 can be for example, aluminum oxide. A plurality of terminal posts 58 are embedded within the ceramic insulator jacket 124. The terminal posts 58, 58a-d supply electrical power to the electrode 36 and heater coils 50, 52 of the electrostatic chuck 20, as shown in FIGS. 1 and 5A. For example, the terminal posts 58 can include copper posts.

The contact bands 140 are configured to surround the terminal posts 58, 58a-d, of the electrical terminal assembly, as shown in FIG. 7. Each contact band 140 comprises metal, such as, for example, a copper alloy. The structural body of the contact band 140 comprises a casing 142 adapted to fit around a terminal post 58. The shape of the casing 142 is dependent upon the shape of the post 58 and optimally, should mimic the shape of the post 58. A portion or a strip 146 of the casing 142 comprises a band 144 with a plurality of slots 148 and a plurality of heat transfer louvers 150; the slots 148 configured in a pattern to consequently create the louvers 150 alternating with the slots 148. In one embodiment, the plurality of slots 148 and louvers 150 extend from a top edge 152 of the strip 146 to the bottom edge 154 of the strip 146 or a portion of the casing 142. The plurality of slots 148 and louvers 150 create a spring-like characteristic reducing the stiffness of the casing 142 and allowing it to conform around the outside surface of the terminal post 58 or terminal. The configuration of the plurality of slots 148 on the strip 146 of the casing 142 also, through its spring-like characteristics, causes the terminal post 58 to be in contact with substantial regions of the inner exposed surfaces 143 of the casing 142. This allows for optimal heat transfer between the contact band 140 and the terminal.

A ring assembly 170 can also be provide to reduce the formation of process deposits on, and protect from erosion, peripheral regions of the substrate support 90 comprising the electrostatic chuck 20 supported by the base 91, as shown in FIG. 5A. In the embodiment shown in FIG. 5B, the ring assembly 170 comprises a clamp ring 100 comprising an annular body 171 having holes 175 that are secured to the peripheral portion 98 of the top surface 94 of the base 91 with securing means such as screws or bolts 169. The clamp ring 100 has an upper lip 172 which extends radially inward from a top surface 174 and an outer side surface 176 which forms the radially outer perimeter of the clamp ring 100. The lip 172 has an undersurface 173 which is sized to fit and rest on the first step 31 of the peripheral ledge 29 of the ceramic puck 24. In one version, the lip 172 has an undersurface 173 which is adapted to form a gas-tight seal between the ceramic puck 24 and the base 91. For example, the undersurface 173 can comprise a polymer, such as a polymer layer, for example polyimide, to form a good seal. The clamp ring 100 is fabricated from a material that can resist erosion by plasma, for example, a metallic material such as stainless steel, titanium or aluminum; or a ceramic material, such as aluminum oxide.

The ring assembly 170 also includes an edge ring 180 comprising a band 182 having a foot 184 which rests on the top surface 174 of the clamp ring 100 as shown in FIG. 5B. The edge ring 180 also has an annular outer wall 186 enclosing the outer side surface 176 of the clamp ring 100 which would otherwise be exposed to the processing environment to reduce or prevent deposition of sputtering deposits on the clamp ring 100. The edge ring 180 also has a flange 190 covering the second step 33 of the peripheral ledge 29 of the ceramic puck 24. The flange 190 comprises a projection 194 that terminates below an overhanging edge 196 of the substrate 25. The flange 190 defines an inner perimeter of the edge ring 180 that surrounds the periphery of the substrate 25 to protect regions of the ceramic puck 24 that are not covered by the substrate 25 during processing. The clamp ring 100 and the edge ring 180 of the ring assembly 170 cooperate to reduce the formation of process deposits on, and protect from erosion, the electrostatic chuck 20 supported on the base 91 during the processing of a substrate 25. The edge ring 180 also protects the exposed side surfaces of the substrate support 90 to reduce erosion in the process. The ring assembly 170 can be easily removed to clean deposits from the exposed surfaces of the clamp ring 100, and edge ring 180, so that the entire substrate support 90 does not have to be dismantled to be cleaned. The edge ring 180 can be made from a ceramic, such as for example, quartz.

Another version of the ring assembly 170 that can reduce the formation of process deposits on, and protect from erosion, the substrate support 90 comprising the electrostatic chuck 20 and base 91, is shown in FIG. 5C. In this version, the clamp ring 100 comprises an annular body 171 having a top surface 174 for supporting an edge ring 180 and a bottom surface 192 with a plurality of holes 175 adapted to be secured to the peripheral portion 98 of the top surface 94 of the base 91. The annular body 171 is secured to the peripheral portion 98 of the top surface 94 of the base 91 by screws or bolts 169 that mate with the holes 175. The clamp ring 100 also has an upper lip 172 that extends radially inward to rest on the first step 31 of the peripheral ledge 29 of the ceramic puck 24. The upper lip 172 of the clamp ring 100 can also have a downwardly projecting bump 192 that rests on the first step 31 of the peripheral ledge 29 of the ceramic puck 24 to minimize contact area, and downwardly projecting bump 193 extending out from a radially outward bottom recess 194. The upper lip 172 of the clamp ring 100 comprises an undersurface 173 which rests on the first step 31 of the peripheral ledge 29 of the ceramic puck 24, and this undersurface 173 comprises, in one version, a polymer, such as a layer of polymer, for example, a polyimide. The undersurface 173 can also be the surface of the bump 193, for example, the bump 193 can be made of the undersurface material. The outer portion 194 of the clamp ring 100 comprises a radially outer side surface 176 which is flat and terminates at an outer diameter 196 of the base 91. The clamp ring 100 also has a foot 197 which extends downward from the radially outer side surface 176 to rest on the peripheral portion 98 of the top surface 94 of the base 91. The clamp ring 100 can be made from a metal such as aluminum, titanium or stainless steel; or a ceramic, such as aluminum oxide.

The version of the edge ring 180 shown in FIG. 5C, comprises a band 182 which is wedge-shaped with an inclined upper surface 183. A lower surface 185 of the band 182 covers the top surface 174 of the clamp ring 100. The edge ring 180 also has an inner flange 187 that extends radially inward from the wedge-shaped band 182. The inner flange 187 comprises a bottom surface 188 that is stepped up in relation to the lower surface 185 of wedge-shaped band 182. The inner flange 187 also has a foot 189 that can rest on the first step 33 of the peripheral ledge 29 of the ceramic puck 24. The inner flange 187 further comprises an upper surface 191 which has a radially inward perimeter comprising an upper step 232 and a lower step 234. The upper and lower steps 232, 234, step down in height along the radially inward direction. The inner flange 187 also has a curved edge 236 that joins to the inclined upper surface 183 of the wedge-shaped band 182. An outer flange 238 of the edge ring 180 extends radially outward from the wedge-shaped band 182. The outer flange 238 comprises a radially inward facing surface 240 that covers the outer side surface 176 of the clamp ring 100. The outer flange 238 further has a bottom wall 242 that extends downwardly in relation to the lower surface 185 of wedge-shaped band 182. The outer flange 238 also has a slanted perimeter edge 244 which reduces erosion of this region. The edge ring 180 can also be made from a ceramic, such as quartz.

Another embodiment of the electrostatic chuck 20 comprises a ceramic puck 24 with a substrate receiving surface 26, as shown in FIGS. 4C and 4C1. The substrate receiving surface 26 comprises a pattern of grooves 250 comprising radial arms 252 and circular arms 254 which are interconnected to one another. In between these grooves 250 are raised plateaus 256 of spaced apart mesas 258. In the version shown, the raised plateaus 256 have an arcuate side edge 257 and are generally triangular or trapezoid shaped. However, the raised plateaus 256 can also have other shapes and can be distributed across the substrate receiving surface 26 in a non-symmetrical pattern. Each raised plateau 256 is defined by a plurality of mesas 258 that can, for example, number from about 10 to about 1000 mesas. In one version, the mesas 258 are raised cylindrical bumps, for example, shaped as cylinders or arcuate projections. For example, the mesas 258 can be cylinders having average diameters of from about 5 to about 50 microns and heights of from about 0.5 to about 5 mm. The mesas 258 are provided in a shape, size, and spatial distribution across the surface 26 to control the contact area with the overlying substrate to regulate heat transfer rates from the substrate to different regions of the ceramic puck 24.

A plurality of heat transfer gas conduits 38a,b (see FIG. 1) traverse through the ceramic puck 24 and terminate in one or more central ports 40a and peripheral ports 40b located in the pattern of grooves 250 on the substrate receiving surface 26. The central and peripheral ports 40a,b are capable of providing heat transfer gas to a central zone 42a and a peripheral zone 42b, respectively, of the substrate receiving surface 26. The peripheral ports 40b terminate in the arcuate cut-outs 259 which are surrounded by a radially inner gas sealing rim 260 and a radially outer gas sealing rim 262 to define the peripheral zone 42b. The central ports 40a can terminate at intersections of the central arms 252 and radial arms 254 of the grooves 250 to define a region corresponding to the central zone 42a. The central and peripheral heating zones 42a,b of the substrate receiving surface 26 of the ceramic puck 24 allow corresponding overlying central and peripheral portions 46a,b of the substrate 25, respectively, to be maintained at different temperatures (FIG. 8).

In this version, the ceramic puck 24 has a backside surface 28 (not shown) opposing the substrate receiving surface 26 which can be planar and absent mesas, or which can have mesas previously described. The ceramic puck 24 also has a peripheral ledge 29 having a first step 31 and a second step 33, the second step 33 being radially outward from, and lower than, the first step 31. The ceramic puck 24 is made from aluminum oxide, aluminum nitride, silicon oxide, silicon carbide, silicon nitride, titanium oxide, zirconium oxide, or mixtures thereof; by hot pressing and sintering a ceramic powder and machining the sintered ceramic form to form the final shape of the puck 24. The grooves 250, mesas 258, gas conduits 38a,b and ports 40a,b, and other structures are machined into the ceramic structure.

In the version shown in FIG. 4D, the base 91 comprises a metal body 92 with a top surface 94 (not shown) having a chuck receiving portion 96 and a peripheral portion 98 which extends radially outward beyond the ceramic puck 24. In this version, the base 91 comprises a single channel 110 for circulating a fluid, such as water, to serve as a heat exchanger. The fluid circulating channel 110 comprises a serpentine channel which has a plurality of curved hump regions 260a-c which are distributed non-uniformly or asymmetrically across the base 91. A greater length of the channel 110 is provide to pass through or across those regions of the base 91 which get hotter in use, and a shorter length is used at the cooler regions of the base 91. The resultant asymmetric fluid circulating channel 110 controls the fluid flow to maintain uniform temperatures across the base 91.

The substrate support 90 comprising the electrostatic chuck 20 and the base 91, can be used in a substrate processing apparatus 200, and exemplary version of which is illustrated in FIG. 8. The apparatus 200 comprises a chamber 201 comprising enclosing walls 202, and in one version, the chamber 201 is a DPS Advantage Chamber. A gas source 204 provides a process gas to the chamber through gas holes 203, the process gas being capable of processing the substrate 25, such as an etching gas, for example, a halogen-containing gas such as chlorine or hydrogen chloride; or a deposition gas, such as a CVD or PVD gas, for example, a gas for depositing dielectric or semiconducting materials. A gas energizer 208 is provided to capacitively or inductively couple RF energy to the process gas respectively, or transmit microwave energy into the process gas (not shown), to form an energized gas to process the substrate 25. For example, the process gas can be energized capacitively by applying an RF voltage to the electrode 36 of the electrostatic chuck 20 via an electrode power supply 230 and electrically grounding a wall 202 of the chamber 201. The electrode power supply 230 also provides a DC chucking voltage to charge the electrode 36 of the chuck 20 to electrostatically hold the substrate 25. The process gas can also be energized by coupling inductive energy to the process gas via the inductor coil 205. Alternatively, the process gas can be energized by coupling microwave energy to the process gas via a microwave conduit in a remote chamber (not shown). The substrate 25 is held in the chamber 201 on a receiving surface 26 of the electrostatic chuck 20, which in turn rests on the base 91.

The chamber is controlled by a controller 212 which typically comprises as a computer having a central processing unit (CPU), such as a Pentium processor commercially available from Intel Corporation, Santa Clara, Calif., coupled to a memory and peripheral computer components. The memory may include a removable storage, such as a CD or floppy drive; a non-removable storage, such as a hard drive; and random access memory (RAM). The controller 212 may further comprise a hardware interface comprising analog or digital input and output boards, and motor controller boards. An operator can communicate with the chamber controller 212 via a display or data input device. To select a particular screen or function, the operator enters the selection using the data input device, such as a keyboard or light pen.

The controller 212 also comprises a computer-readable program stored in the memory, comprising program code capable of controlling and monitoring the processes conducted in the chamber 201. The computer-readable program may be written in any conventional computer-readable programming language. Suitable program code is entered into single or multiple files using a conventional text editor and stored or embodied in computer-usable medium of the memory. If the entered code text is in a high level language, the code is compiled, and the resultant compiler code is then linked with an object code of pre-compiled library routines. To execute the linked, compiled object code, the user invokes the object code, causing the CPU to read and execute the code to perform the tasks identified in the program. The program can include a temperature control instruction set to control the temperatures at different regions of the substrate 25, by for example, independently applying different electrical power levels to the first and second heater coils 50, 52 in the ceramic puck 24 of the chuck 20, adjust the flow of heat transfer gas through the conduits 38a,b and controlling the flow rate of fluid through the channels 110 of the base 91. A process feedback control instruction set can serve as a feedback control loop between a temperature monitoring instruction set which receives temperature signals from the optical temperature sensors 60a,b to adjust the power applied to the chamber components, such as the heater coils 50, 52, flow of heat transfer gas through the conduits 38a,b, and flow of fluid through the channels 110 of the base 91. While described as separate instruction sets for performing a set of tasks, each of these instruction sets can be integrated with one another or may be over-lapping; thus, the chamber controller 212 and the computer-readable program described herein should not be limited to the specific version of the functional routines described herein.

Although the present invention has been described in considerable detail with regard to certain preferred versions thereof, other versions are possible. For example, the substrate support can be used for other chambers and for other processes, than those described herein. Therefore, the appended claims should not be limited to the description of the preferred versions contained herein.

What is claimed is:

1. An electrostatic chuck for receiving a substrate in a process chamber, the chuck comprising:

(a) a ceramic puck comprising (i) a substrate receiving surface having a plurality of raised plateaus defined by spaced apart mesas, the raised plateaus being distributed across the substrate receiving surface in a non-symmetrical pattern, (ii) an opposing backside surface, and (iii) central and peripheral portions;

(b) a plurality of heat transfer gas conduits traversing the ceramic puck and terminating in ports on the substrate receiving surface to provide heat transfer gas to the substrate receiving surface;

(c) an electrode embedded in the ceramic puck to generate an electrostatic force to retain a substrate placed on the substrate receiving surface; and (d) a plurality of heater coils embedded in the ceramic puck, the heater coils being radially spaced apart and concentric to one another.

2. A chuck according to claim 1 wherein the heater coils include a first heater coil located at the peripheral portion of the ceramic puck and a second heater coil located at the central portion of the ceramic puck.

3. A chuck according to claim 1 wherein the heater coils are arranged side by side and substantially in the same plane.

4. A chuck according to claim 1 wherein the heater coils each comprise at least one of
(i) a resistive heating element comprising molybdenum; and
(ii) an electrical resistance sufficiently high to maintain the substrate receiving surface of the ceramic puck at temperatures of from about 80 to about 250° C.

5. A chuck according to claim 1 wherein the ceramic puck is composed of at least one of aluminum oxide, aluminum nitride, silicon oxide, silicon carbide, silicon nitride, titanium oxide, zirconium oxide, and mixtures thereof.

6. A chuck according to claim 1 wherein the ceramic puck comprises a peripheral ledge to receive a clamp ring that forms a seal around the ceramic puck.

7. A chuck according to claim 1 wherein the raised plateaus are generally triangular or trapezoid shaped, and are separated by grooves.

8. A chuck according to claim 7 wherein the mesas comprise at least one of
(i) from about 10 to about 1000 mesas;
(ii) an average height of from about 5 to about 50 microns; and
(iii) an average diameter of from about 0.5 to about 5 mm.

9. A chuck according to claim 1 wherein the backside surface further comprises backside mesas.

10. A chuck according to claim 1 wherein the heater coils are independently controllable.

11. A chuck according to claim 1 wherein the first and second heater coils are arranged side by side and substantially in the same plane.

12. A ring assembly for the electrostatic chuck of claim 1 supported by a base in a substrate process chamber, the ceramic puck having a peripheral ledge having first and second steps, and the base having a top surface with a chuck receiving portion and a peripheral portion extending beyond the electrostatic chuck, the ring assembly comprising:
(a) a clamp ring comprising (i) a top surface, (ii) an upper lip that extends radially inward from the top surface to rest on the first step of the peripheral ledge of the ceramic puck, and (iii) an outer side surface which forms a radially outer perimeter; and
(b) an edge ring comprising a band having a foot resting on the top surface of the clamp ring, an annular outer wall enclosing the outer side surface of the clamp ring, and a flange covering the second step of the peripheral ledge of the ceramic puck,
whereby the clamp ring and the edge ring cooperate to reduce the formation of process deposits on the electrostatic chuck during the processing of a substrate.

13. An assembly according to claim 12 wherein the edge ring comprises a ceramic.

14. An assembly according to claim 12 wherein the ceramic comprises quartz.

15. An assembly according to claim 12 wherein the clamp ring comprises a metal or ceramic.

16. An assembly according to claim 12 wherein the clamp ring comprises holes that are secured to a peripheral portion of the top surface of the base to form a gas-tight seal.

17. A base for supporting the electrostatic chuck of claim 1 in a substrate process chamber, the base comprising:
(a) a metal body having a top surface comprising (i) a chuck receiving portion to receive the backside surface of the ceramic puck and comprising a peripheral groove, and (ii) a peripheral portion extending beyond the ceramic puck;
(b) a plurality of heat transfer gas passages for supplying heat transfer gas to the heat transfer gas conduits in the ceramic puck;
(c) at least one fluid channel in the metal body for circulating fluid therein; and
(d) an electrical terminal assembly for conducting electrical power to the electrode of the electrostatic chuck.

18. A base according to claim 17 wherein the electrical terminal assembly comprises a ceramic insulator jacket having embedded therein a plurality of terminal posts for supplying electrical power to the electrode and heater coils of the electrostatic chuck, each terminal post surrounded by a contact band comprising a metal and having a plurality of heat transfer louvers.

19. An electrostatic chuck for receiving a substrate in a process chamber, the chuck comprising:
(a) a ceramic puck comprising a substrate receiving surface having a plurality of spaced apart mesas and an opposing backside surface comprising backside mesas;
(b) a plurality of heat transfer gas conduits traversing the ceramic puck and terminating in ports on the substrate receiving surface to provide heat transfer gas to the substrate receiving surface;
(c) an electrode embedded in the ceramic puck to generate an electrostatic force to retain a substrate placed on the substrate receiving surface; and
(d) a plurality of heater coils embedded in the ceramic puck, the heater coils being radially spaced apart and concentric to one another.

20. A base for supporting the electrostatic chuck of claim 19 in a substrate process chamber, the base comprising a metal body having a top surface comprising a chuck receiving portion to receive the backside surface of the ceramic puck, and at least one fluid channel in the metal body.

* * * * *